(12) United States Patent
Kono (10) Patent No.: US 9,882,037 B2
(45) Date of Patent: Jan. 30, 2018

(54) IGBT-FREE WHEELING DIODE COMBINATION WITH FIELD STOP LAYER IN DRIFT REGION

(71) Applicant: DENSO CORPORATION, Kariya, Aichi-pref. (JP)

(72) Inventor: Kenji Kono, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/416,478

(22) Filed: Jan. 26, 2017

(65) Prior Publication Data
US 2017/0222029 A1 Aug. 3, 2017

(30) Foreign Application Priority Data

Jan. 29, 2016 (JP) .................................. 2016-16201

(51) Int. Cl.
| | |
|---|---|
| *H01L 29/739* | (2006.01) |
| *H01L 27/06* | (2006.01) |
| *H01L 29/10* | (2006.01) |
| *H01L 29/36* | (2006.01) |
| *H01L 29/08* | (2006.01) |
| *H01L 29/861* | (2006.01) |

(52) U.S. Cl.
CPC ...... *H01L 29/7397* (2013.01); *H01L 27/0635* (2013.01); *H01L 27/0664* (2013.01); *H01L 29/0804* (2013.01); *H01L 29/0821* (2013.01); *H01L 29/1095* (2013.01); *H01L 29/36* (2013.01); *H01L 29/8613* (2013.01)

(58) Field of Classification Search
CPC ............. H01L 27/0664; H01L 27/0652; H01L 27/0635; H01L 29/7397
See application file for complete search history.

(56) References Cited

U.S. PATENT DOCUMENTS

| | | | |
|---|---|---|---|
| 2004/0041225 A1* | 3/2004 | Nemoto | ................ H01L 21/263 257/458 |
| 2006/0138607 A1 | 6/2006 | Nemoto | |

(Continued)

FOREIGN PATENT DOCUMENTS

| | | |
|---|---|---|
| JP | 2002-176176 A | 6/2002 |
| JP | 2008-258262 A | 10/2008 |

(Continued)

*Primary Examiner* — Asok K Sarkar
*Assistant Examiner* — Grant Withers
(74) *Attorney, Agent, or Firm* — Posz Law Group, PLC (57) ABSTRACT

A semiconductor device includes a middle field stop layer having a first conductivity type impurity concentration higher than a drift layer and arranged at a position in the drift layer. A ratio of a depth of the position of the middle field stop layer from a front surface of a semiconductor substrate to a thickness of the semiconductor substrate is equal to or greater than fifteen percent and equal to or less than thirty-five percent. When an IGBT is arranged in the semiconductor device, vibration of a collector voltage waveform in a switching off of the IGBT is restricted. When a diode is arranged in the semiconductor device, vibration of a recovery waveform in a recovery operation of the diode is restricted. Accordingly, at least one of the vibrations of the recovery waveform and the collector voltage waveform in the switching is restricted.

4 Claims, 11 Drawing Sheets

(56) References Cited

U.S. PATENT DOCUMENTS

| | | | |
|---|---|---|---|
| 2009/0114923 A1* | 5/2009 | Iwamuro | H01L 29/0661 257/77 |
| 2012/0267681 A1 | 10/2012 | Nemoto et al. | |
| 2014/0217407 A1 | 8/2014 | Mizushima et al. | |
| 2014/0246750 A1 | 9/2014 | Takishita et al. | |
| 2014/0284657 A1 | 9/2014 | Nemoto et al. | |
| 2015/0179441 A1 | 6/2015 | Onozawa | |
| 2015/0303248 A1 | 10/2015 | Nemoto et al. | |
| 2015/0349111 A1 | 12/2015 | Yoshikawa | |
| 2016/0111489 A1 | 4/2016 | Nemoto et al. | |

FOREIGN PATENT DOCUMENTS

| | | |
|---|---|---|
| JP | 5162964 B2 | 3/2013 |
| JP | 5320679 B2 | 10/2013 |
| JP | 5396689 B2 | 1/2014 |

\* cited by examiner

IGBT-FREE WHEELING DIODE COMBINATION WITH FIELD STOP LAYER IN DRIFT REGION

CROSS REFERENCE TO RELATED APPLICATION

This application is based on Japanese Patent Application No. 2016-16201 filed on Jan. 29, 2016, the disclosure of which is incorporated herein by reference.

TECHNICAL FIELD

The present disclosure relates to a semiconductor device having at least one of an insulated gate bipolar transistor (hereinafter, referred to as IGBT) and a free-wheeling diode (hereinafter, referred to as FWD).

BACKGROUND

Conventionally, as a vertical switching element for an inverter or the like, for example, a semiconductor device having a reverse-conducting IGBT (RC-IGBT) structure that includes the IGBT and the FWD in one chip has been known.

In such a semiconductor device, a base layer is arranged at a surface layer portion of a semiconductor substrate including an $N^-$-type drift layer and a trench gate structure is arranged to penetrate the base layer.

A P-type collector layer and an N-type cathode layer are arranged adjacent to a rear surface of the semiconductor substrate. An N-type emitter region is arranged at a portion of the base layer located above the collector layer. An upper electrode electrically connected to the base layer and the emitter region is arranged on a front surface of the semiconductor substrate. A lower electrode electrically connected to the collector layer and the cathode layer is arranged on the rear surface of the semiconductor substrate. That is, a region in which the collector layer is arranged at the rear surface of the semiconductor substrate is defined as an IGBT region, and a region in which the cathode layer is arranged at the rear surface of the semiconductor substrate is defined as a diode region. In other words, in the above semiconductor device, a boundary between the collector layer and the cathode layer corresponds to a boundary between the IGBT region and the diode region.

In the semiconductor device including the IGBT region and the FWD region in one chip, the P-type collector layer has relatively low concentration considering a switching loss of the IGBT. In a recovery operation of the FWD, holes are not sufficiently implanted from the low-concentration collector layer in the IGBT region and a recovery waveform vibrates. That is, in the recovery operation of the FWD, carriers are depleted at the rear surface of the semiconductor substrate and a vibration of an anode-cathode voltage is caused by a parasitic capacitor and a parasitic inductor of an external circuit. Due to the vibration, a surge voltage is likely to increase.

In order to further decrease on-resistance, a thickness of the semiconductor device, specifically, a thickness of the drift layer is reduced. However, when the thickness of the semiconductor substrate is reduced, withstand voltage of the semiconductor device decreases because the depletion layer is likely to reach the rear surface of the semiconductor substrate in the switching off of the IGBT. Also, when the thickness of the semiconductor substrate is reduced, holes are depleted and vibration of collector voltage waveform is likely to occur in the switching.

On the other hand, when an impurity concentration of the collector layer is increased, the amount of the implanted holes increases. As a result, the vibrations of the recovery waveform and the collector voltage waveform and the increase of the surge voltage are restricted. However, the switching loss of the IGBT increases. Accordingly, reduction of the surge voltage and reduction of the switching loss of the IGBT are in a trade-off relationship and there is a difficulty in achieving both. Especially, recent minute cell structure having narrow trench gate intervals stores more holes and the holes are likely to remain in the semiconductor substrate. In such a minute cell structure, the impurity concentration of the collector layer at the rear surface of the semiconductor substrate needs to be decreased not to increase the switching loss. As a result, the vibration of the recovery waveform of the FWD is more notable.

To address the above situations, it has been known to arrange an N-type layer having high impurity concentration in the drift layer of the cell region of the semiconductor device in which the IGBT is arranged (for example, see JP 5320679 B2).

Also, it has been known to arrange an N-type layer in a reverse-blocking IGBT (RB-IGBT) to improve reverse withstand voltage. Specifically, in the cell region in which the IGBT and the FWD is arranged, the N-type layer is arranged adjacent to a surface of the drift layer at which the trench gate structure is arranged, that is, the N-type layer is arranged adjacent to a front surface of the drift layer. When the thickness of the drift layer is 100 micrometer (μm), the N-type layer is arranged at a position having a depth of 10 μm from the front surface of the drift layer. That is, the N-type layer is arranged at the position having a depth of 10% of the thickness of the drift layer. As such, the reverse withstand voltage is improved.

SUMMARY

However, there is a possibility that the effects of restricting the vibrations of the recovery waveform and the waveform in the switching are not sufficiently achieved by simply arranging the N-type layer having higher impurity concentration in the drift layer and by arranging the N-type layer at the position having the depth of 10% of the thickness of the drift layer.

Although the RC-IGBT having the IGBT and the FWD is descried as an example of the vertical switching element, the above possibility occurs in a semiconductor device having at least one of the IGBT and the FWD. Namely, in the semiconductor device having only IGBT, there is a possibility that vibration of the collector voltage waveform occurs in the switching off. In the semiconductor device including only FWD, there is a possibility that vibration of the recovery waveform occurs in the recovery operation.

It is an object of the present disclosure to provide a semiconductor device capable of further restricting at least one of a vibration of a recovery waveform and a vibration of a collector voltage waveform in a switching.

According to a first aspect of the present disclosure, a semiconductor device includes a drift layer, a semiconductor layer, a second conductivity type region, an upper electrode, a lower electrode and a middle field stop layer.

The drift layer has a first conductivity type and is arranged in a semiconductor substrate having a front surface and a rear surface. The drift layer has a first conductivity type impurity concentration equal to a first conductivity type impurity concentration of the semiconductor substrate. The semiconductor layer has the first conductivity type or a second conductivity type and is arranged adjacent to the rear surface of the semiconductor substrate. The second conductivity type region has the second conductivity type and is arranged adjacent to the front surface of the semiconductor substrate.

The upper electrode is arranged on the front surface of the semiconductor substrate and is connected to the second conductivity type region. The lower electrode is arranged on the rear surface of the semiconductor substrate and is connected to the semiconductor layer.

The middle field stop layer has a first conductivity type impurity concentration higher than the first conductivity type impurity concentration of the drift layer. The middle field stop layer is arranged at a position in the drift layer. A ratio of a depth of the position of the middle field stop layer from the front surface of the semiconductor substrate to a thickness of the semiconductor substrate is equal to or greater than fifteen percent. The ratio of the depth of the position of the middle field stop layer to the thickness of the semiconductor substrate is equal to or less than thirty-five percent.

According to the first aspect of the present disclosure, the middle field stop layer having the first conductivity type impurity concentration higher than the first conductivity type impurity concentration of the drift layer is arranged at the middle position of the drift layer in a thickness direction of the drift layer. The ratio of the depth of the position of the middle field stop layer from the front surface of the semiconductor substrate to the thickness of the semiconductor substrate is equal to or greater than fifteen percent of the thickness of the semiconductor substrate and equal to or less than thirty-five percent of the thickness of the semiconductor substrate.

When an IGBT is arranged in the semiconductor device, vibration of a collector voltage waveform in a switching off of the IGBT is restricted. When a diode is arranged in the semiconductor device, vibration of a recovery waveform in a recovery operation of the diode is restricted. Accordingly, at least one of the vibrations of the recovery waveform and the collector voltage waveform in the switching is restricted.

BRIEF DESCRIPTION OF THE DRAWINGS

The above and other objects, features and advantages of the present disclosure will become more apparent from the following detailed description made with reference to the accompanying drawings, in which like parts are designated by like reference numbers and in which.

DETAILED DESCRIPTION

Embodiments of the present disclosure will be described with reference to the drawings. In the following embodiments, parts that are the same as each other and similar to each other will be designated by the same symbols.

First Embodiment

A semiconductor device according to a first embodiment will be described. The semiconductor device according to the first embodiment has an RC-IGBT structure in which one IGBT and one FWD are arranged on a substrate, as a vertical semiconductor device flowing current in a direction along a thickness of the substrate. For example, this kind of semiconductor device is employed as a power switching element for a power source circuit such as an inverter, a DC-DC converter and the like. Specifically, the semiconductor device according to the first embodiment is provided as follows.

Figure 1:
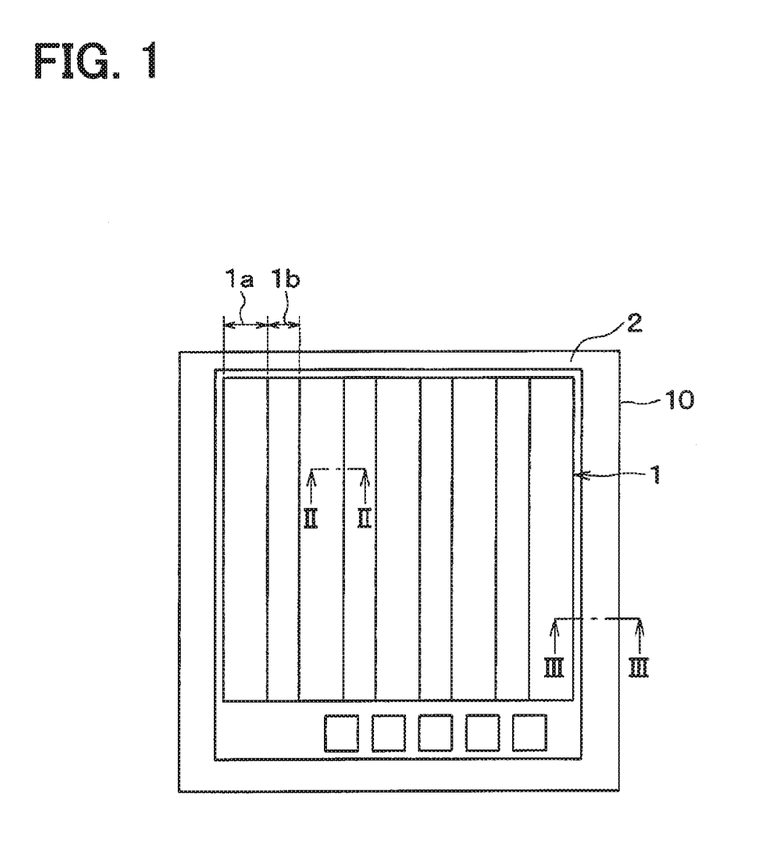
FIG. 1 is a schematic plan view of a semiconductor device according to a first embodiment of the present disclosure.

As shown in FIG. 1, the semiconductor device includes a cell region 1 and an outer peripheral region 2 surrounding the cell region. The semiconductor device is provided by silicon as the semiconductor.

Figure 2:
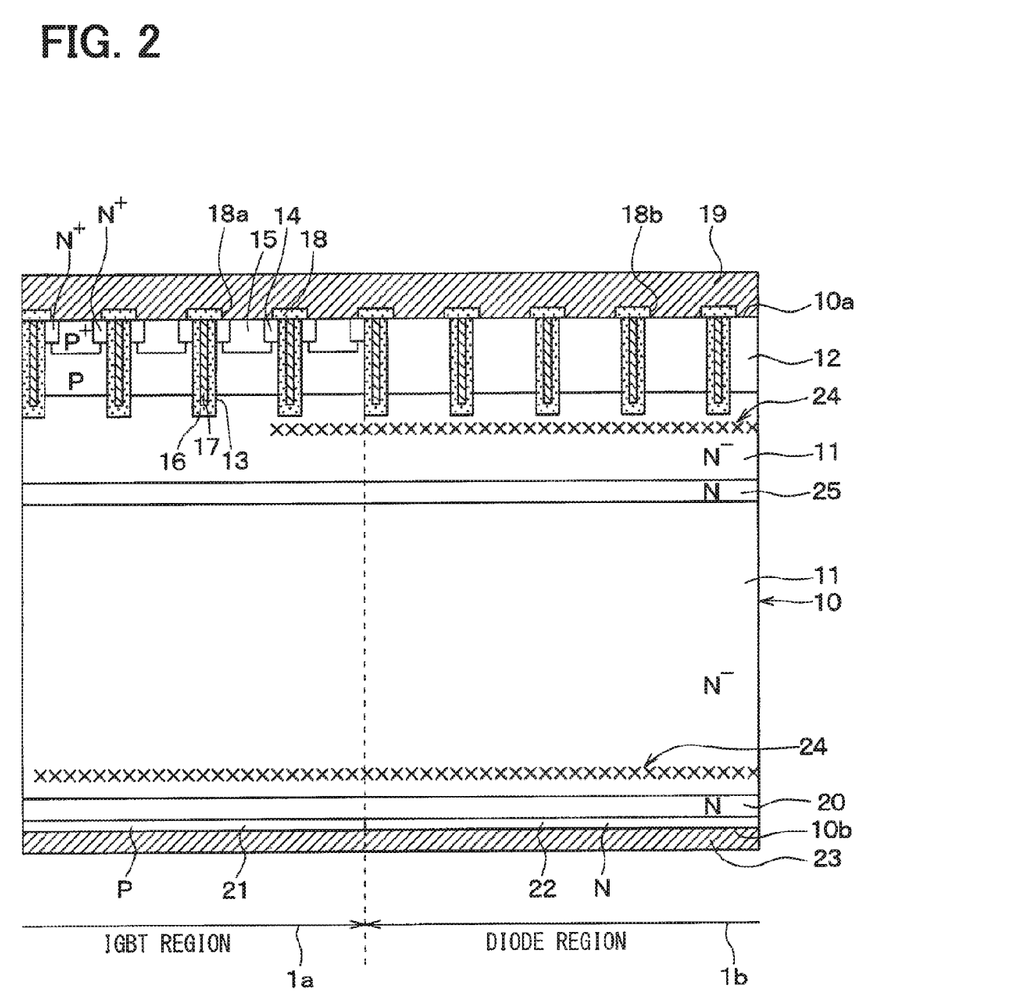
FIG. 2 is a cross-sectional view taken along a line II-II of FIG. 1.
Figure 3:
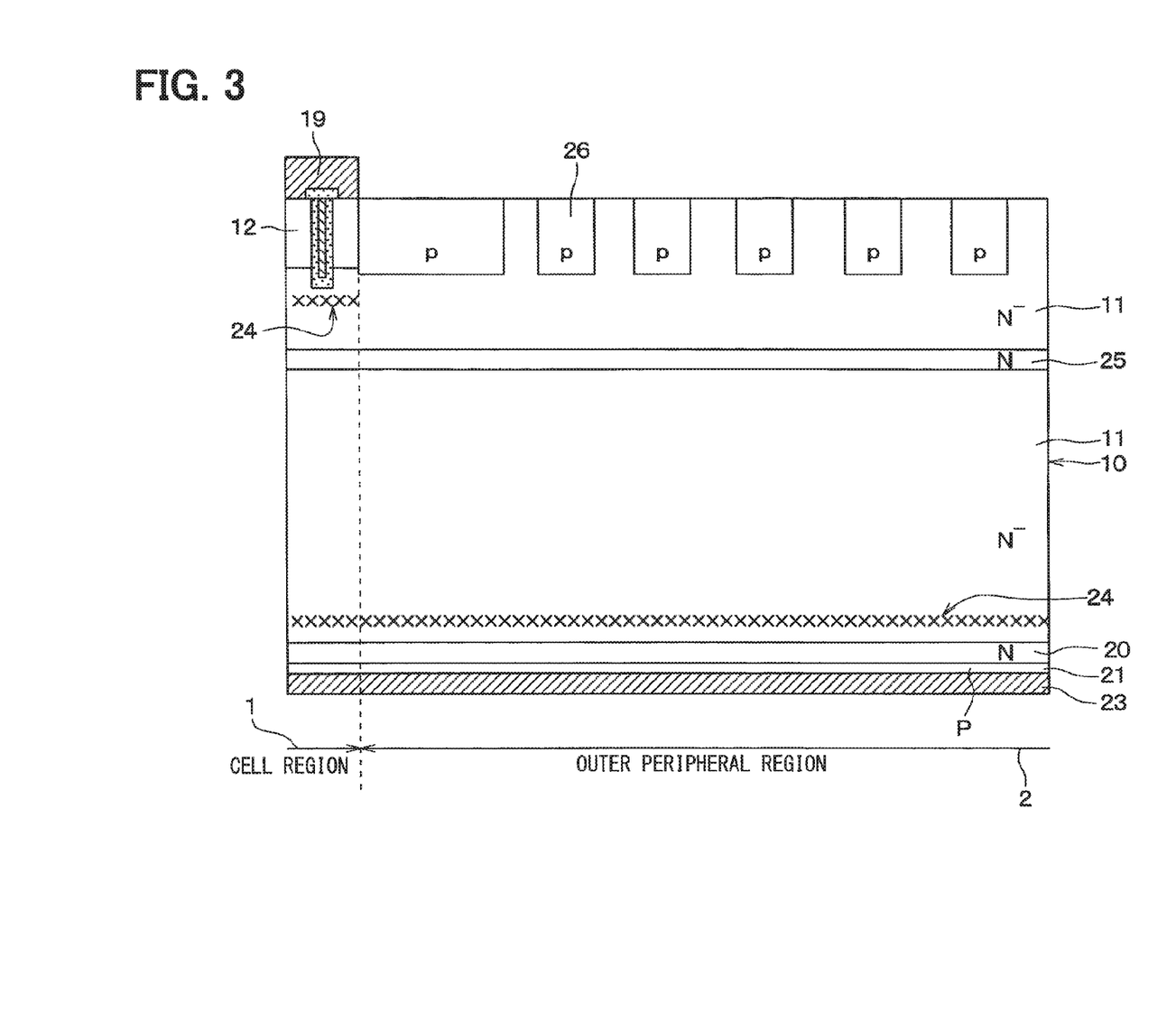
FIG. 3 is a cross-sectional view taken along a line of FIG. 1.

As shown in FIG. 1, FIG. 2 and FIG. 3, the cell region 1 includes an IGBT region 1a and a diode region 1b. The IGBT is arranged in the IGBT region 1a and the FWD is arranged in the diode region 1b. The IGBT region 1a and the diode region 1b are arranged alternately in the cell region 1.

Specifically, as shown in FIG. 2, both the IGBT region 1a and the diode region 1b are arranged in an $N^-$-type semiconductor substrate 10 and provide one chip. The $N^-$-type semiconductor substrate 10 functions as a drift layer 11. The IGBT region 1a and the diode region 1b extend along one direction (i.e., an extension direction) of a front surface 10a of the semiconductor substrate 10. That is, the IGBT region 1a and the diode region 1b extend along a vertical direction of the paper of FIG. 1. The IGBT region 1a and the diode region 1b are arranged alternately in a direction perpendicular to the extension direction.

A P-type base layer 12 is arranged above the drift layer 11. That is, the P-type base layer 12 is arranged adjacent to the front surface 10a of the semiconductor substrate 10. Trenches 13 are arranged to penetrate the base layer 12 and reach the drift layer 11 and the trenches 13 divide the base layer 12 into plural portions.

In the first embodiment, the trenches 13 extend along one direction in the front surface 10a of the semiconductor substrate 10, that is, the trenches 13 extend along a depth direction of the paper of FIG. 2. The trenches 13 are arranged at equal intervals in a horizontal direction of the paper of FIG. 2. The front surface 10a of the semiconductor substrate 10 is provided by a surface of the base layer 12 opposite to the drift layer 11.

The base layer 12 functions as a channel region in the IGBT region 1a. Specifically, a portion of the base layer 12 that is in contact with a trench gate structure, which will be described later, functions as the channel region. In the base layer 12 functioning as the channel region, that is, in the portion of the base layer 12 in the IGBT region 1a, N$^+$-type emitter regions 14 and P$^+$-type body regions 15 are arranged. Each of the body regions 15 is sandwiched between the emitter regions 14.

Each of the emitter regions 14 has an impurity concentration higher than the drift layer 11. The emitter region 14 ends within the base layer 12 and is in contact with a side of the trench 13. Each of the body regions 15 has an impurity concentration higher than the base layer 12. The body region 15 ends within the base layer 12, similarly to the emitter region 14.

For details, the emitter region 14 has a stick shape extending along the longitudinal direction of the trench 13 and is in contact with the side of the trench 13. An end of the emitter region 14 is located inside of an end of the trench 13. In other words, the end of the emitter region 14 is located shallower than the end of the trench 13 in the longitudinal direction of the trench 13. The body region 15 is sandwiched by two emitter regions 14. The body region 15 has a stick shape extending along the longitudinal direction of the trench 13, that is, extending along the emitter region 14. In the first embodiment, the body region 15 extends deeper than the emitter region 14 with respect to the front surface 10a of the semiconductor substrate 10.

Each of the trenches 13 is filled with a gate insulation film 16 and a gate electrode 17. The gate insulation film 16 is arranged to cover an inner wall surface of the trench 13. The gate electrode 17 is arranged on the gate insulation film 16. For example, the gate electrode 17 is made of poly silicon. As described hereinabove, the trench gate structure is provided.

An inter-layer insulation film 18 is arranged on the front surface 10a of the semiconductor substrate 10 above the base layer 12. For example, the inter-layer insulation film 18 is made of BPSG. The inter-layer insulation film 18 has contact holes 18a and contact holes 18b. The contact holes 18a expose portions of the emitter regions 14 and the body regions 15 in the IGBT region 1a. The contact holes 18b expose the base layer 12 in the diode region 1b.

An upper electrode 19 is arranged on the inter-layer insulation film 18. In the IGBT region 1a, the upper electrode 19 is electrically connected to the emitter regions 14 and the body regions 15 through the contact holes 18a, and is electrically connected to the base layer 12 through the body regions 15. In the diode region 1b, the upper electrode 19 is electrically connected to the base layer 12 through the contact holes 18b. Accordingly, the upper electrode 19 functions as an emitter electrode in the IGBT region 1a, and functions as an anode electrode in the diode region 1b.

An N-type field stop layer (hereinafter, referred to as FS layer) 20 is arranged opposite to the base layer 12 with respective to the drift layer 11. That is, the FS layer 20 is arranged adjacent to a rear surface 10b of the semiconductor substrate 10 opposite to the front surface 10a. The FS layer 20 has an N-type impurity concentration higher than the drift layer 11. The FS layer 20 is arranged to improve withstand voltage and stationary loss by restricting the depletion layer from spreading. Also, the FS layer 20 is arranged to control the amount of holes implanted from the rear surface 10b of the semiconductor substrate 10. For example, the FS layer 20 has N-type impurity concentration from $1\times10^{15}$ to $1\times10^{16}$ cm$^{-3}$.

In the IGBT region 1a, a P-type collector layer 21 is arranged opposite to the drift layer 11 with respect to the FS layer 20. In the diode region 1b, an N-type cathode layer 22 is arranged opposite to the drift layer 11 with respect to the FS layer 20. That is, the IGBT region 1a and the diode region 1b are divided according to whether a layer arranged on the rear surface 10b of the semiconductor substrate 10 is the collector layer 21 or the cathode layer 22.

For example, the collector layer 21 has the P-type impurity concentration from $1\times10^{17}$ to $1\times10^{18}$ cm$^{-3}$. The collector layer 21 has a width of around 300 to 3000 µm in the direction in which the collector layer 21 and the cathode layer 22 are arranged. The cathode layer 22 has the N-type impurity concentration of $1\times10^{19}$ cm$^{-3}$. The cathode layer 22 has a width of around 100 to 1000 µm in the direction in which the collector layer 21 and the cathode layer 22 are arranged. The collector layer 21 and the cathode layer 22 are arranged in every several hundred µm to several. For example, the collector layer 21 and the cathode layer 22 are arranged in every 500 µm to 4 mm.

As described above, in the first embodiment, the rear surface 10b of the semiconductor substrate 10 is defined by the collector layer 21 and the cathode layer 22. In the first embodiment, the collector layer 21 is arranged, with respect to the FS layer 20, opposite to the portion of the base layer 12 in which the emitter regions 14 and the body regions 15 are arranged. The cathode layer 22 is arranged, with respect to the FS layer 20, opposite to portion of the base layer 12 in which the emitter regions 14 and the body regions 15 are not arranged. That is, in the first embodiment, a boundary between the IGBT region is and the diode region 1b corresponds to a boundary between the portion of the base layer 12 in which the emitter regions 14 and the body regions 15 are arranged and the portion of the base layer 12 in which the emitter regions 14 and the body regions 15 are not formed.

The thickness and the impurity concentration of the semiconductor substrate 10 providing the drift layer 11 of the vertical semiconductor element is set according to the resistance required as the rating. For example, when the rating voltage is 800V, the semiconductor substrate 10 has the thickness of 80 µm and the N-type impurity concentration of around $1\times10^{14}$ cm$^{-3}$. When the rating voltage is 1200 V, the semiconductor substrate 10 has the thickness of 120 µm and the N-type impurity concentration of around $7\times10^{13}$ cm$^{-3}$.

When the base layer 12, the FS layer 20, the collector layer 21 and the cathode layer 22 are formed by the ion implantation or the like, the thickness of the semiconductor substrate 10 includes the thicknesses of the base layer 12, the FS layer 20, the collector layer 21 and the cathode layer 22. Basically, since the withstand voltage of the semiconductor device depends on the thickness of the drift layer 11, the thickness of the semiconductor substrate 10 corresponds to the thickness of the portion of the semiconductor substrate 10 functioning as the drift layer 11. However, since the thicknesses of the base layer 12 and the like are small enough compared to the thickness of the drift layer 11, the thickness of the semiconductor substrate 10 may be considered as defining the withstand voltage of the semiconductor device.

A lower electrode 23 is arranged on the collector layer 21 and the cathode layer 22, that is, arranged adjacent to the rear surface 10b of the semiconductor substrate 10. The lower electrode 23 functions as the collector electrode in the IGBT region 1a and functions as the cathode electrode in the diode region 1b.

According to the above configuration, in the IGBT region 1a, an IGBT in which the base layer 12 functions as a base, the emitter region 14 functions as an emitter, and the collector layer 21 functions as a collector is provided. In the diode region 1b, a PN-junction FWD in which the base layer 12 functions as an anode, and the drift layer 11, the FS layer 20 and the cathode layer 22 function as a cathode is provided.

In the semiconductor substrate 10, damage regions 24 are arranged adjacent to the front surface 10a and the rear surface 10b. Specifically, the damage region 24 adjacent to the front surface 10a is arranged in the diode region 1b and extends from the diode region 1b toward the IGBT region 1a. That is, the damage region 24 is arranged in the diode region 1b and a portion of the IGBT region 1a adjacent to the boundary between the IGBT region 1a and the diode region 1b. The damage region 24 adjacent to the rear surface 10b is arranged entirely in the diode region 1b and the IGBT region 1a.

The holes of the drift layer 11 in the IGBT region 1a (i.e., excess carriers) are recombined with electrons and canceled in the damage region 24 arranged in the IGBT region 1a. Accordingly, the damage region 24 restricts the holes from being implanted from the IGBT region 1a to the diode region 1b.

Furthermore, in the first embodiment, a middle FS layer 25 is arranged entirely in the cell region 1, that is, in both of the IGBT region 1a and the diode region 1b. The middle FS layer 25 is arranged at a middle position of the drift layer 11 in the thickness direction.

The middle FS layer 25 is formed by doping the N-type impurity having a concentration 1 to 6 times of a raw concentration of the semiconductor substrate 10 including the drift layer 11, the raw concentration being an impurity concentration in the crystal growth of the semiconductor ingot for forming the semiconductor substrate 10. Therefore, the N-type impurity concentration of the middle FS layer 25 is 2 to 7 times of the impurity concentration of the drift layer 11. In the following descriptions, a ratio of the N-type impurity concentration doped to the middle FS layer 25 to the raw concentration of the semiconductor substrate 10 including the drift layer 11 will be referred to as a concentration ratio N.

The middle FS layer 25 is located at the position having a depth of 15% to 35% of the thickness of the semiconductor substrate 10 from the front surface 10a. The depth of the position of the middle FS layer 25 is defined as a depth of a center position of the middle FS layer 25 in the thickness direction. Since the thickness of the middle FS layer 2 is quite small, as described later, the position of the middle FS layer 25 may be defined not considering the thickness of the middle FS layer 25. Hereinafter, a ratio of the depth of the position of the middle FS layer 25 to the thickness of the semiconductor substrate 10 will be simply referred to as a depth ratio.

As described above, when the rating voltage is 800V, for example, the semiconductor substrate 10 has the thickness of 80 μm and the N-type impurity concentration of $1 \times 10^{14}$ cm$^{-3}$. In this case, the middle FS layer 25 is arranged at the position having the depth 12 to 28 μm from the front surface 10a of the semiconductor substrate 10 and the middle FS layer 25 has the N-type impurity concentration from 2 to $7 \times 10^{14}$ cm$^{-3}$. Similarly, when the rating voltage is 1200V, the semiconductor substrate 10 has the thickness of 120 μm and the N-type impurity concentration of $7 \times 10^{13}$ cm$^{-3}$. In this case, the middle FS layer 25 is arranged at the position having the depth 18 to 42 μm from the front surface 10a of the semiconductor substrate 10 and the middle FS layer 25 has the N-type impurity concentration from 1.4 to $4.9 \times 10^{14}$ cm$^{-3}$.

The middle FS layer 25 has the thickness of around 10 μm. Although the thickness of the middle FS layer 25 may be arbitrarily chosen, the thickness of the middle FS layer 25 basically depends on a condition of acceleration of the dopant conducted by an accelerator such as Cyclotron of an ion implantation device for forming the middle FS layer 25. For example, when the semiconductor substrate 10 is formed of the silicon and the middle FS layer 25 is formed by proton irradiation, the thickness of the middle FS layer 25 is around 10 μm.

Figure 4A:
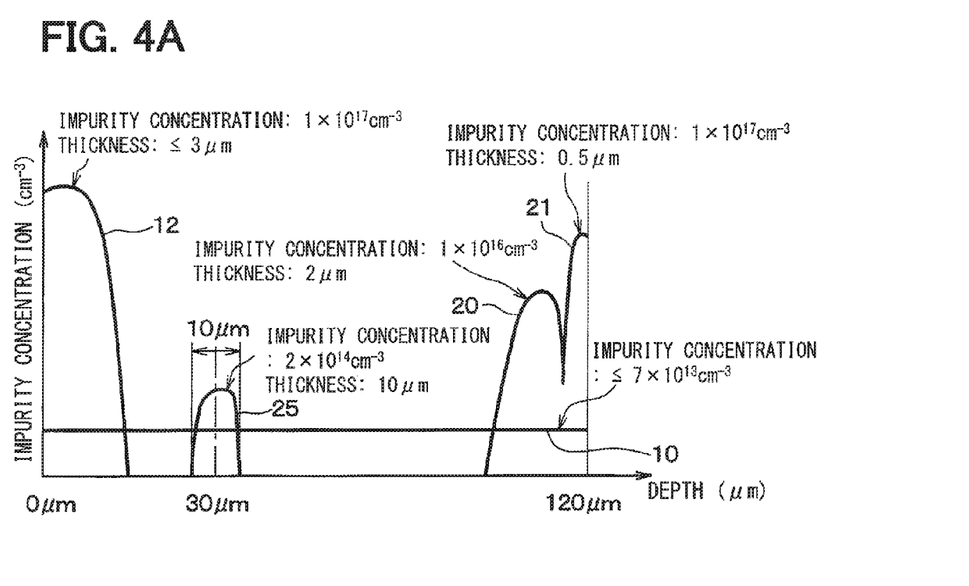
FIG. 4A is a diagram illustrating a distribution of an impurity concentration at a position passing through a collector layer in a direction along a thickness of the semiconductor device.
Figure 4B:
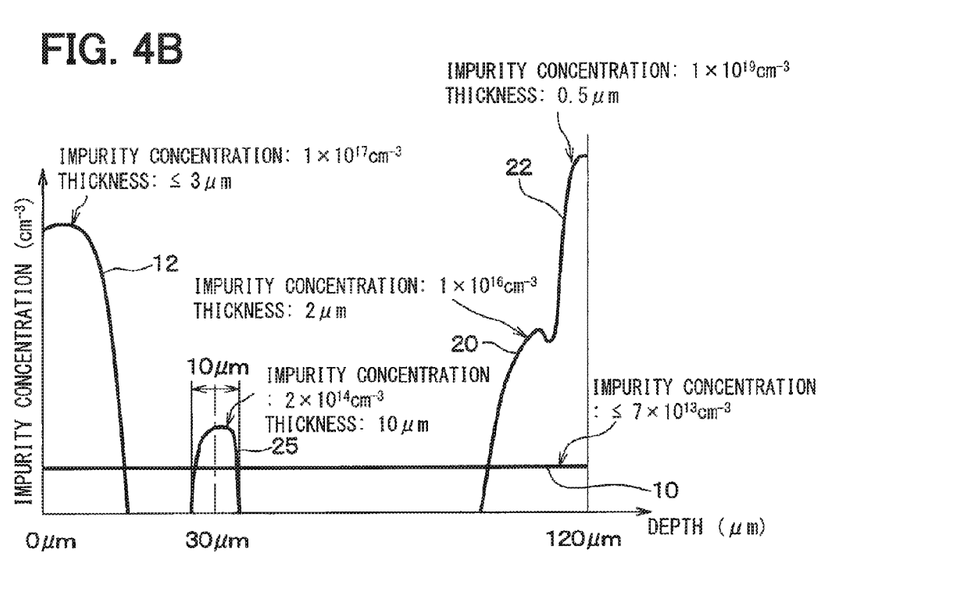
FIG. 4B is a diagram illustrating a distribution of an impurity concentration at a position passing through a cathode layer in the direction along the thickness of the semiconductor device.

For example, distributions of the impurity concentration of the IGBT region 1a and the diode region 1b in the thickness direction of the semiconductor substrate 10 are shown in FIG. 4A and FIG. 4B. As shown in the above drawings, for example, the raw concentration of the semiconductor substrate 10, that is, the N-type impurity concentration of the drift layer 11 is $5 \times 10^{13}$ cm$^{-3}$ and the thickness of the drift layer 11 is 120 μm. In this case, for example, the thickness of the base layer 12 is equal to or less than the 3 μm and the P-type impurity concentration of the base layer 12 is equal to or less than $1 \times 10^{17}$ cm$^{-3}$. The thickness of the collector layer 21 is equal to or less than the 0.5 μm and the P-type impurity concentration of the collector layer 21 is equal to or less than $1 \times 10^{17}$ cm$^{-3}$. The thickness of the cathode layer 22 is equal to or less than the 0.5 μm and the N-type impurity concentration of the cathode layer 22 is equal to or less than $1 \times 10^{19}$ cm$^{-3}$. The thickness of the FS layer 20 is equal to or less than the 2 μm and the N-type impurity concentration of the FS layer 20 is equal to or less than $1 \times 10^{16}$ cm$^{-3}$.

In such a configuration, for example, the middle FS layer 25 is located at the position having the depth of around 30 μm. The thickness of the middle FS layer 25 is equal to around 10 μm and the N-type impurity concentration of the middle FS layer 25 is equal to or less than $2 \times 10^{14}$ cm$^{-3}$.

The N-type impurity concentration of the middle FS layer 25 does not have to be uniform in the thickness direction of the middle FS layer 25. The peak concentration of the N-type impurity concentration of the middle FS layer 25 has the above described concentration.

On the other hand, in the outer peripheral region 2, the collector layer 21 is arranged adjacent to the rear surface 10b of the semiconductor substrate 10. As shown in FIG. 3, the P-type guard rings 26 are arranged in the outer peripheral region 2. Each of the guard rings 26 has a frame shape surrounding the cell region 1. The guard ring 26 extends to a position deeper than the base layer 12 and has an impurity concentration higher than the base layer 12. For example, the impurity concentration of the guard ring 26 is less than $1.0 \times 10^{19}$ cm$^{-3}$. In the first embodiment, one of the guard rings 26 arranged closest to the cell region 1 is in contact with the base layer 12 in the diode region 1b.

Figure 5:
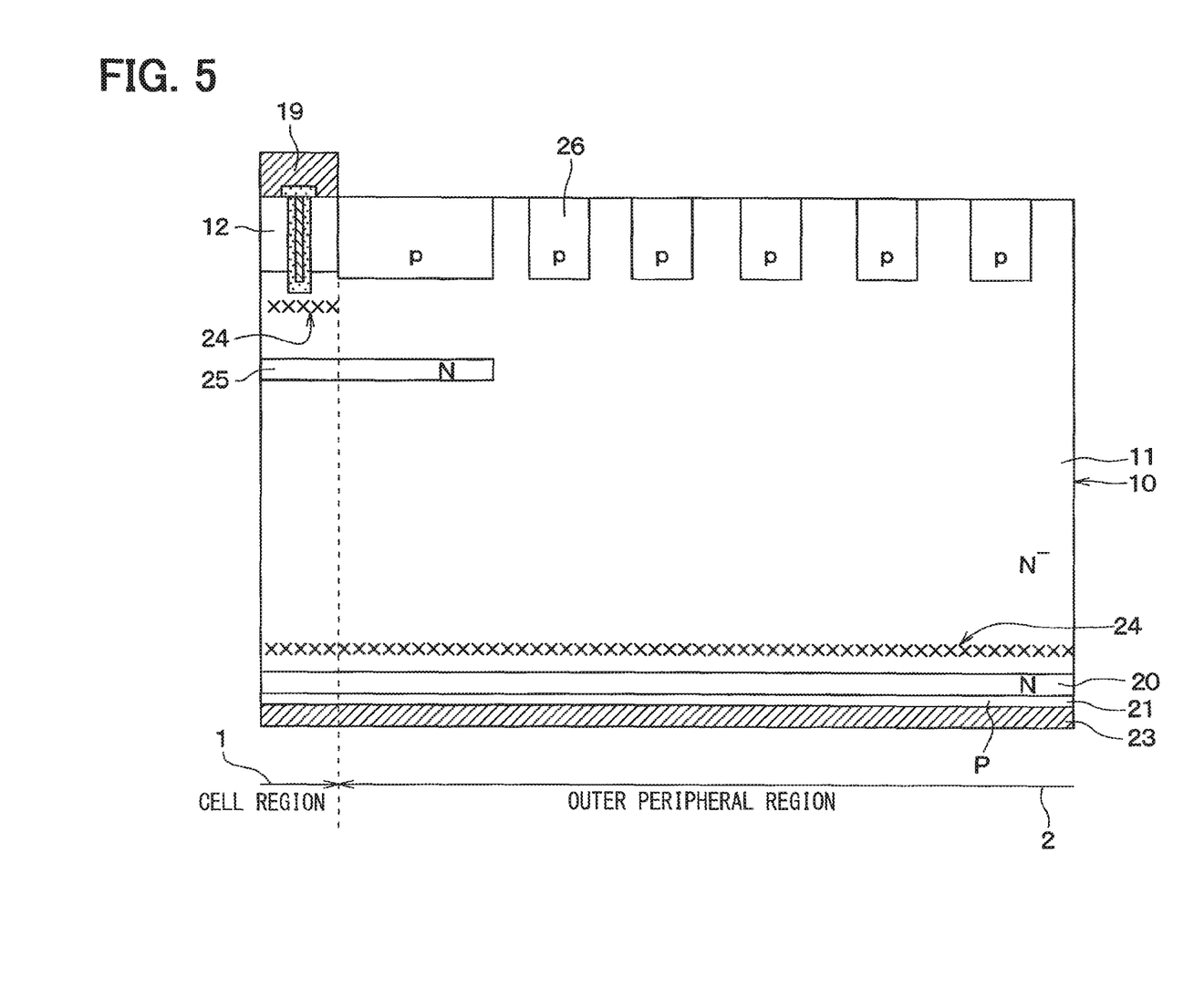
FIG. 5 is a cross-sectional view taken along a line of FIG. 1 according to a modification of the first embodiment in which a middle FS layer is formed by employing a mask.

In the first embodiment, as shown in FIG. 3, the middle FS layer 25 is arranged in the outer peripheral region 2. However, the middle FS layer 25 may be arranged only in the cell region 1 and the portion of the outer peripheral region 2 as shown in FIG. 5. The middle FS layer 25 is formed by the ion-implantation of the N-type impurity. When the mask is not employed in the ion-implantation, the middle FS layer 25 is arranged in the outer peripheral region 2. When the mask covering an outside portion of the outer peripheral region 2 is employed, the middle FS layer 25 is arranged only in the cell region other than the outer peripheral region 2. When the mask covering the outer peripheral region 2 is employed, the middle FS layer 25 is not arranged at least at an outside portion of the outer peripheral region 2.

As described above, the semiconductor device having the RC-IGBT structure according to the first embodiment is provided. In such a semiconductor device, the process for forming the middle FS layer 25 needs to be conducted. Basically, the middle FS layer 25 is produced in the method similar to the conventional method. The middle FS layer 25 may be formed in any stages in the process for producing the semiconductor device. In the first embodiment, after the base layer 12, the body regions 15, the emitter regions 14 and the trench gate structures are formed at the front surface 10a of the semiconductor substrate 10, the FS layer 20, the collector layer 21 and the cathode layer 22 are formed at the rear surface 10b of the semiconductor substrate 10. Then, the middle FS layer 25 is formed.

In details, after the above portions including the base layer 12 are formed at the front surface 10a of the semiconductor substrate 10, the rear surface 10b of the semiconductor substrate 10 is ground and etched to be flattened. The ions are implanted into the real surface 10b of the semiconductor substrate 10 and then the laser annealing is conducted to form the FS layer 20, the collector layer 21 and the cathode layer 22. Then, crystal defects are formed by irradiating He (helium) line and the annealing treatment for recovering the defects is conducted around 400 degrees Celsius (° C.) for several hours to form the damage regions 24. Then, protons are irradiated from the rear surface 10b of the semiconductor substrate 10 and the annealing treatment is conducted to form the middle FS layer 25. Specifically, the protons are irradiated by employing the ion-implantation device. For example, the protons are irradiated under the condition where the accelerating voltage of the Cyclotron is about 4 Mev and the dose amount is $1 \times 10^{12}$ cm$^{-2}$. The annealing treatment is conducted around 400° C. for several hours. The middle FS layer 25 is formed hereinabove. The step of irradiating the He line and the step of irradiating the proton may be conducted in the reverse order.

The middle FS layer 25 may be formed from the front surface 10a, instead of the rear surface 10b, of the semiconductor substrate 10. However, when the middle FS layer 25 is formed after the trench gate structure is formed, it is preferable to irradiate the protons from the rear surface 10b of the semiconductor substrate 10 so as not to damage the gate insulation film 16. In this case, although the middle FS layer 25 is formed before the upper electrode 19 and the lower electrode 23 are formed, the middle FS layer 25 may be formed after the upper electrode 19 and the lower electrode 23.

Next, operations and effects of the semiconductor device of the present embodiment will be described.

The IGBT formed in the IGBT region 1a is turned on and turned off by controlling voltage applied to the gate electrode 17. That is, the current is flown between the emitter and the collector or the current is interrupted (i.e., switching operation). The FWD formed in the diode region 1b operates as the diode according to the switching operation of the IGBT and reduces the surge voltage in the switching.

Since the semiconductor device of the present embodiment has the middle FS layer 25, in the above operations, the vibrations of the recovery waveform and the collector voltage waveform in the switching are further restricted.

When in the switching off of the IGBT, the depletion layer spreads from the front surface 10a toward the rear surface 10b of the semiconductor substrate 10. When the middle FS layer 25 is arranged, since the middle FS layer 25 has higher N-type impurity concentration, the middle FS layer 25 restricts the depletion layer from spreading. Therefore, the holes serving as the carriers are likely to remain in the portion of the semiconductor substrate 10 adjacent to the rear surface 10b with respect to the center of the semiconductor substrate 10 in the thickness direction.

Also, in the recovery operation of the FWD, the middle FS layer 25 restricts the depletion layer from spreading and the holes serving as the carriers are likely to remain in the portion of the semiconductor substrate 10.

As such, in the switching off of the IGBT and the recovery operation of the FED, the carriers are restricted from being depleted at the rear surface 10b of the semiconductor substrate 10, and at least a small amount of tail current flows when the IGBT is turned off. As a result, the vibration of the collector voltage waveform in the switching off of the IBGT and the vibration of the recovery waveform in the recovery operation of the FWD, i.e., the vibration of the anode-cathode voltage are restricted. That is, the increase of the surge voltage is restricted.

The above effects of reducing the surge voltage are achieved even though the impurity concentration of the collector layer 21 is not increased. Therefore, both effects of reducing the surge voltage and reducing the switching loss of the IGBT are achieved.

Specifically, in the conventional semiconductor device without the middle FS layer 25, as described above, the collector voltage is likely to vibrate in the switching off of the IGBT, the recovery waveform of the FWD is likely to vibrate in the recovery operation and the surge voltage is likely to increase.

Figure 6:
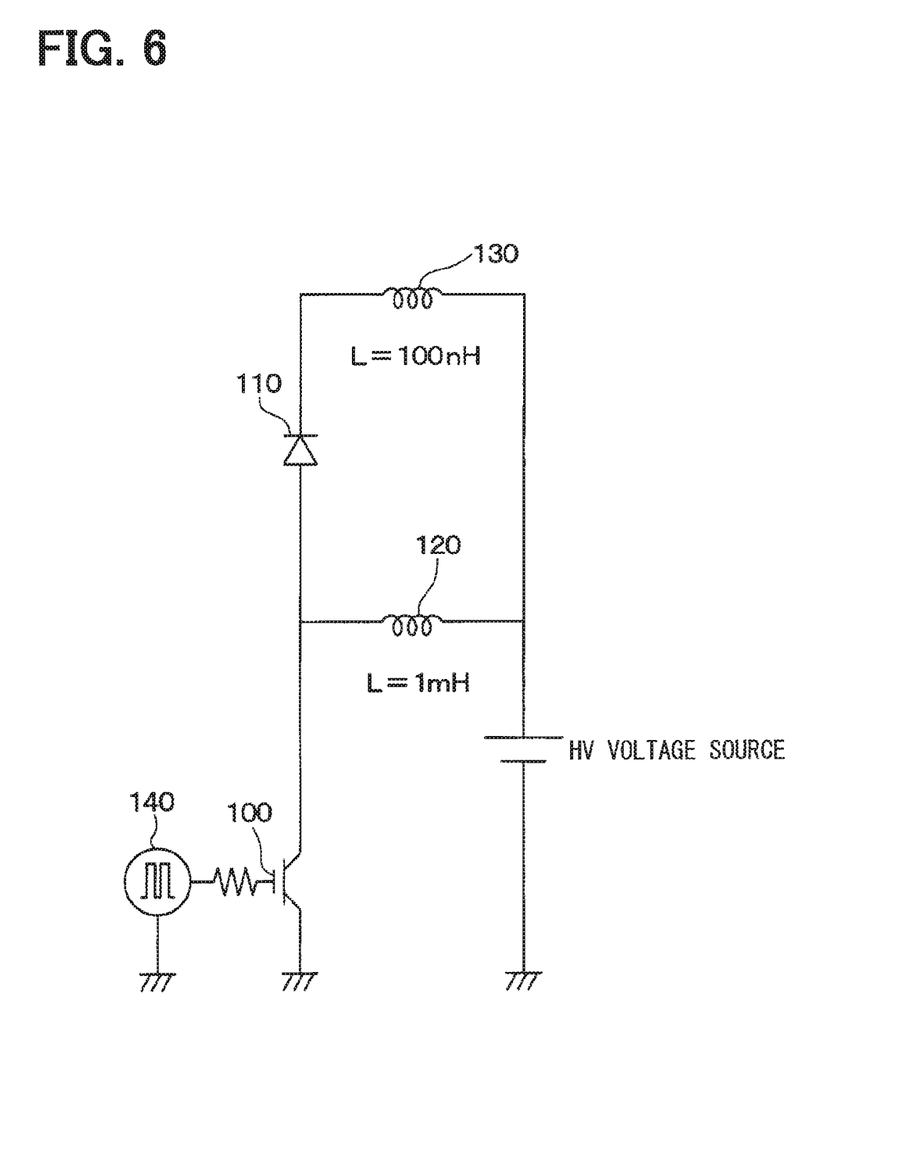
FIG. 6 is all electric circuit diagram illustrating a circuit model for simulating the semiconductor device.
Figure 7A:
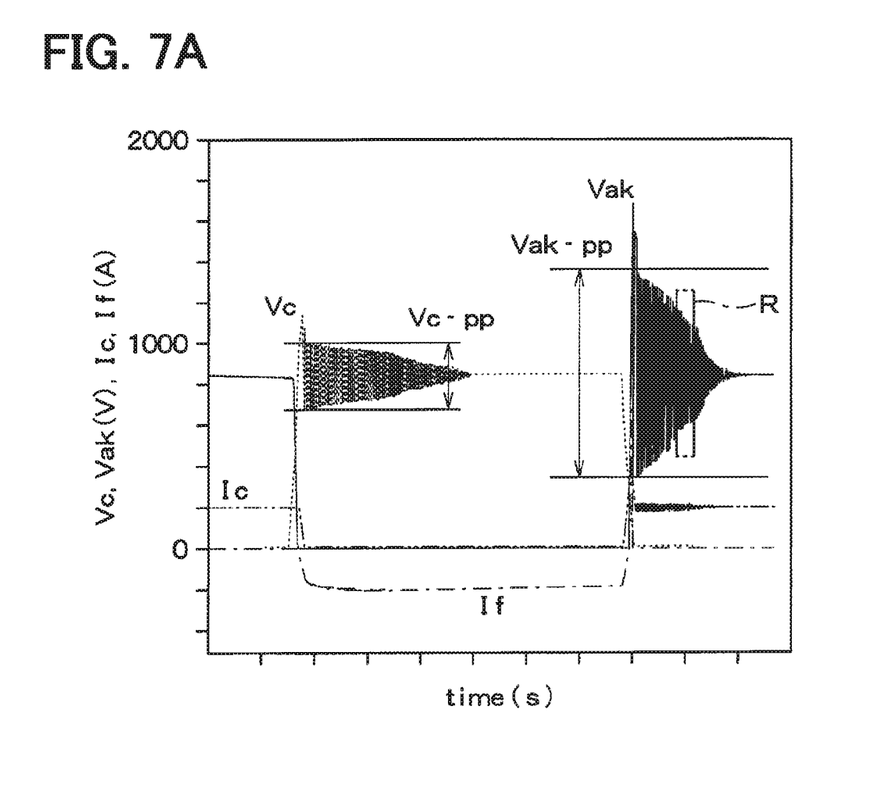
FIG. 7A is a diagram illustrating waveforms of the IGBT in the switching-off and the FWD in the recovery operation, without the middle FS layer.
Figure 7B:
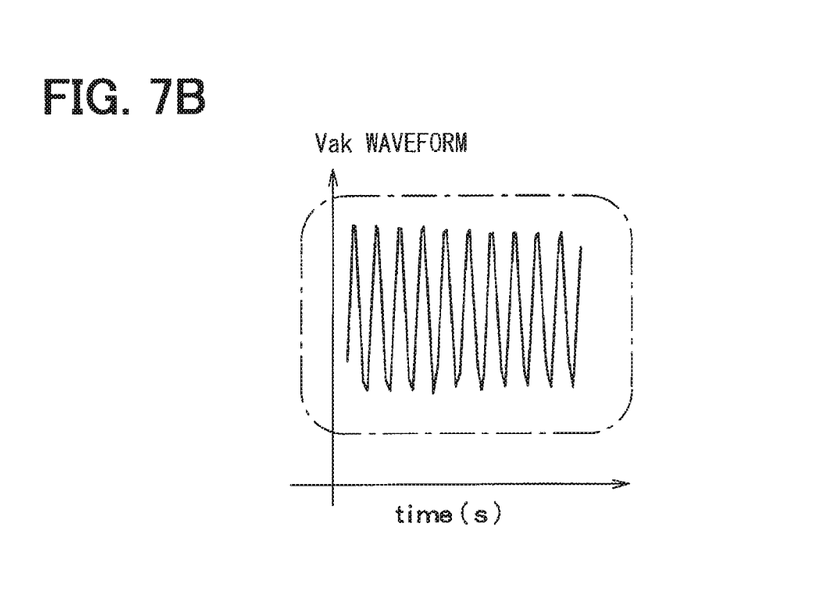
FIG. 7B is an enlarged view of a region R in FIG. 7A.

For example, a simulation is conducted with a circuit model shown in FIG. 6. The circuit model shown in FIG. 6 corresponds to the structure according to the present embodiment without the middle FS layer 25. The IGBT is represented by an element 100 and the FWD is represented by the element 110. For example, an inductance 120 in which L=1 mH and an inductance 130 in which L=100 nH are added, assuming the L component of the load. The gate voltage applied from the gate driving power source 140 to the IGBT 100 is controlled to switch the on/off of the IGBT 100. The recovery operations of the FWD 110 in the switching are observed. That is, the recovery operations when the FWD 110 is shifted from on to off and from off to on are observed. As a result, waveforms of the collector current Ic, the collector voltage Vc, the anode-cathode voltage Vak and the recovery current If shown in FIG. 7A are obtained. FIG. 7B shows an enlarged waveform of a portion of FIG. 7A surrounded by the broken line.

As shown in the above drawings, the collector voltage Vc and the anode-cathode voltage Vak vibrate. When the carries are depleted at the rear surface 10b of the semiconductor substrate 10 in the switching off of the IGBT 100 and the recovery operation of the FWD 110, the vibrations of the collector voltage Vc and the anode-cathode voltage Vak are caused by the parasitic capacitor and the parasitic inductor of the external circuit.

Figure 8:
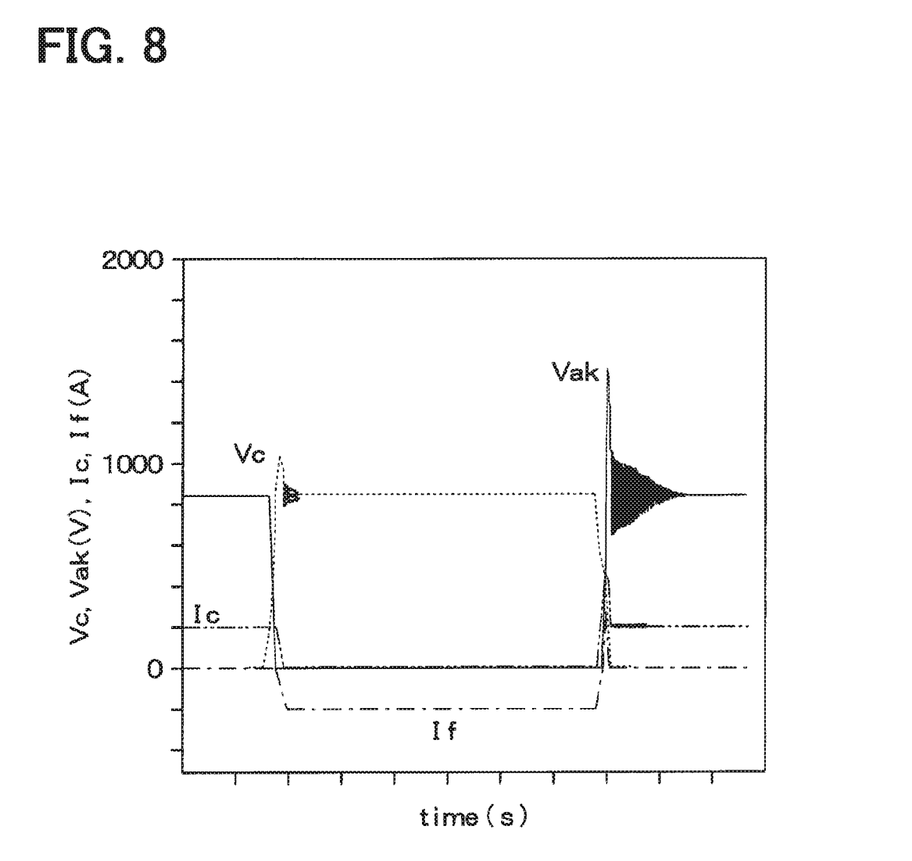
FIG. 8 is a diagram illustrating waveforms of the IGBT in the switching-off and the FWD in the recovery operation, with the middle FS layer.

On the other hand, when the middle FS layer 25 of the present embodiment is added to the circuit model shown in FIG. 6, results shown in FIG. 8 are obtained for the IGBT 100 and the FWD 110. When the middle FS layer 25 is added as described in the present embodiment, the holes serving as the carrier are likely to remain in the portion adjacent to the rear surface 10b of the semiconductor substrate 10. That is, the carriers are restricted from being depleted at the portion adjacent to the rear surface 10b of the semiconductor substrate 10 in the switching off of the IGBT 100 and the recovery operation of the FWD. As a result, the vibrations of the collector voltage Vc and the anode-cathode voltage Vak are restricted as shown in FIG. 8.

Also, since the middle FS layer 25 is arranged at the position having the depth ratio of 15% to 35%, the above effects are increased. This will be described with reference to FIG. 9 to FIG. 11.

Figure 9:
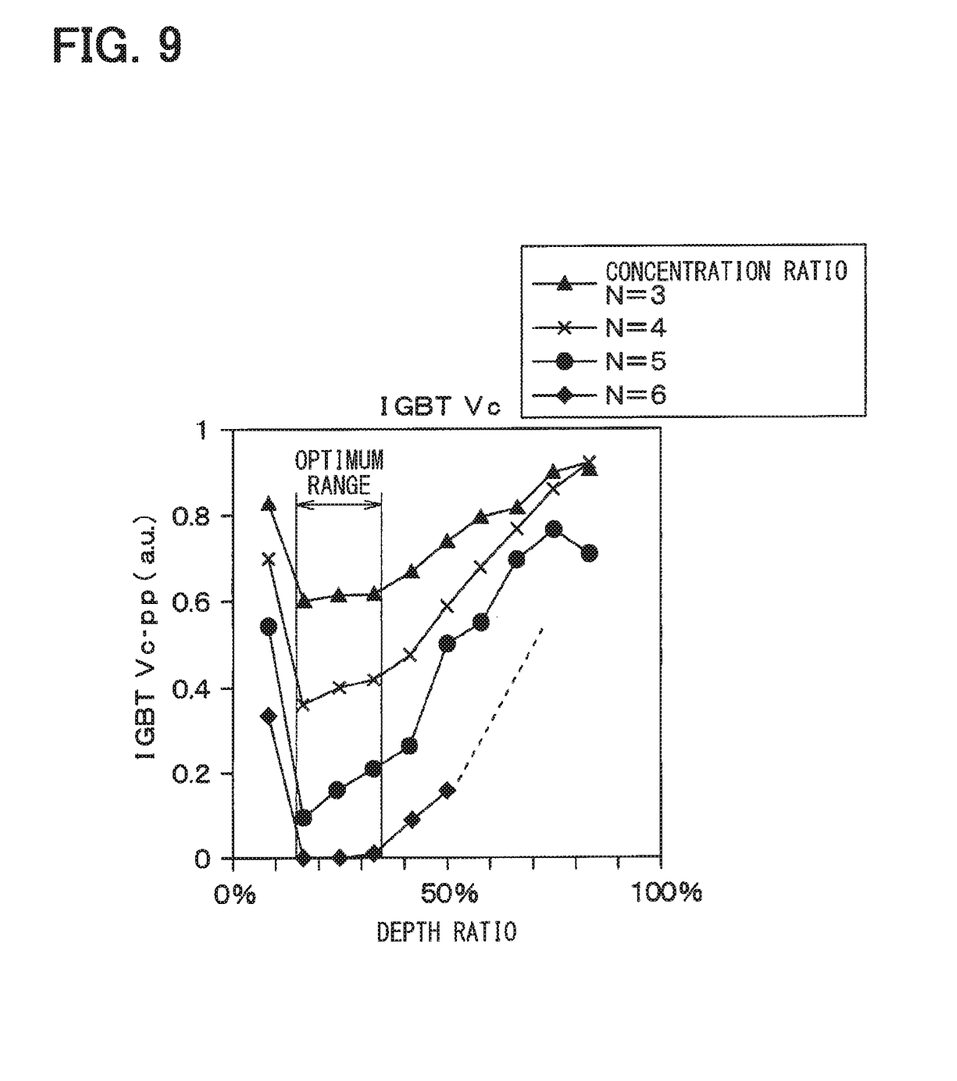
FIG. 9 is a diagram showing results of a depth ratio and a vibration waveform Vc-pp of the collector voltage Vc of the IGBT measured by employing the simulation with the circuit model shown in FIG. 6.
Figure 10:
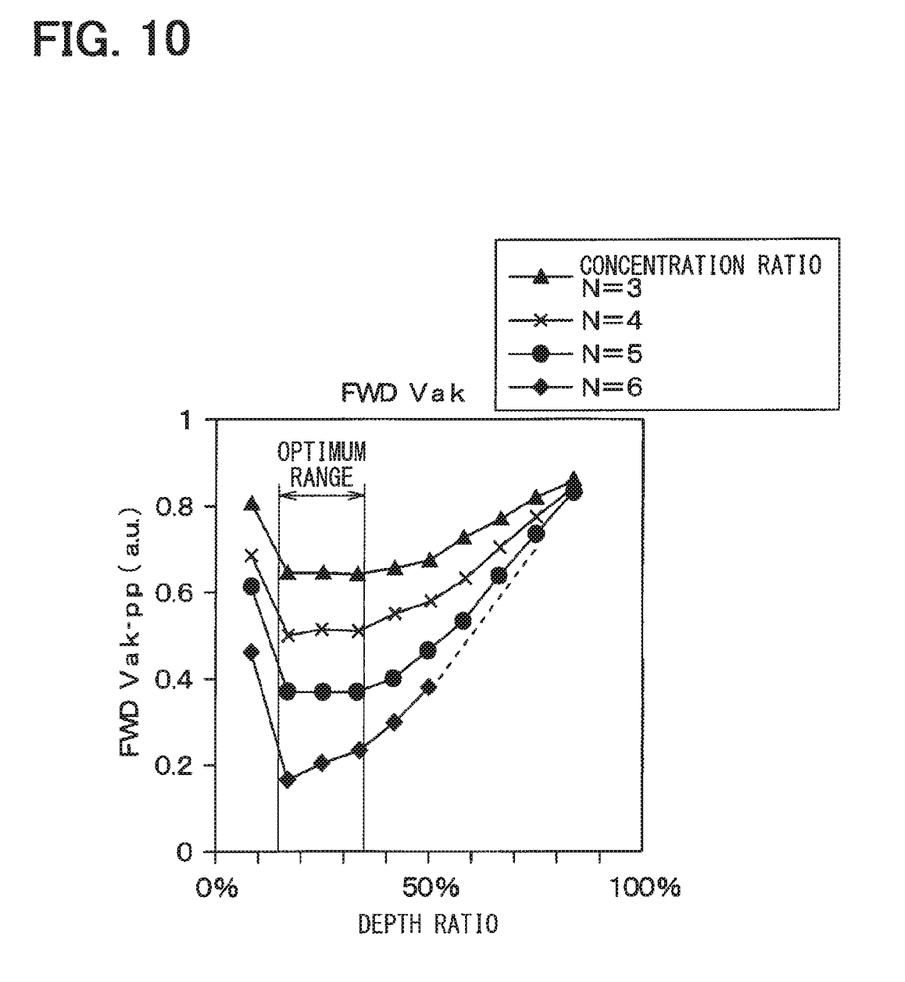
FIG. 10 is a diagram showing results of a depth ratio and a vibration waveform Vak-pp of an anode-cathode voltage Vak of the FWD measured by the simulation with the circuit model shown in FIG. 6.

In the above circuit model, the effects of the position of the middle FS layer 25 on the vibrations of the collector voltage Vc and the anode-cathode voltage Vak are examined by varying the N-type impurity concentration of the middle FS layer 25. As a result, a simulation result of a vibration voltage Vc-pp shown in FIG. 9 is obtained, the vibration voltage Vc-pp corresponding to difference between the local maximum value and the local minimum value of the collector voltage Vc shown in FIG. 7A. Similarly, a simulation result of vibration voltage yak-pp shown in FIG. 10 is obtained, the vibration voltage Vak-pp corresponding to difference between the local maximum value and the local minimum value of the anode-cathode voltage Vak shown in FIG. 7B. Each horizontal axis in FIG. 9 and FIG. 10 represents the depth ratio of the position of the middle FS layer 25.

As shown in FIG. 9 and FIG. 10, the vibration voltage Vc-pp of the collector voltage Vc and the vibration voltage Vak-pp of the anode-cathode voltage Vak vary according to the position of the middle FS layer 25. Both of the vibration voltages Vc-pp and yak-pp decrease as the position of the middle FS layer 25 becomes deeper (i.e., farther) from the front surface 10a of the semiconductor substrate 10. When the depth ratio of the middle FS layer 25 is 15% to 30%, the vibration voltages Vc-pp and Vak-pp are the smallest. When the position of the middle FS layer 25 further becomes deeper from the front surface 10a of the semiconductor substrate 10, conversely, both of the vibration voltages Vc-pp and Vak-pp increase.

The values of the vibration voltages Vc-pp and Vak-pp vary according to the N-type impurity concentration of the middle FS layer 25. The vibration voltages Vc-pp and Vak-pp decrease as the N-type impurity concentration increases. Although FIG. 9 shows the simulation results in which the N-type impurities having the concentration ratio of 3 to 6 are doped in the middle FS layer 25, the similar results are obtained in the case of the concentration ratio of 1 to 2.

As described above, when the middle FS layer 25, which has the N-type impurity concentration higher than the semiconductor substrate 10, is arranged at the position (i.e., an optimum position) having the depth ratio of 15% to 35% (i.e., an optimum range), both of the vibration voltages Vc-pp and Vak-pp are decreased.

That is, the vibrations of the collector voltage waveform in the switching off of the IGBT and the recovery waveform in the recovery operation of the FWD are restricted and the increase of the surge voltage is restricted. Since the surge voltage is reduced without increasing the impurity concentration of the collector layer 21, both of the reduction of the surge voltage and the reduction of the switching loss of the IGBT are achieved.

The above effects of restricting the vibrations are achieved by the middle FS layer 25 having the N-type impurity concentration higher than the raw concentration of the semiconductor substrate 10. However, when the N-type impurity concentration of the middle FS layer 25 is too high, there is a possibility that the depletion layer does not spread and the withstand voltage of the semiconductor device decreases. On the other hand, when the concentration ratio N of the middle FS layer 25 is larger than 6, the effects of restricting the vibration voltages Vc-pp and yak-pp reach the limit and further improvement are not obtained. Therefore, it is preferable that the concentration ratio N of the middle FS layer 25 is equal to or less than 6, considering the decrease of the withstand voltage and the effects of restricting the vibrations. It is further preferable to set the concentration ratio N based on the required withstand voltage.

For example, the withstand voltage of the IGBT within the temperature range considering the usage environment of the semiconductor device (e.g., −40° C. to 150° C.) is examined by varying the N-type impurity concentration of the middle FS layer 25 under the condition that the middle FS layer 25 is arranged at the position having the depth ratio 25%. The results are shown in FIG. 11.

Figure 11:
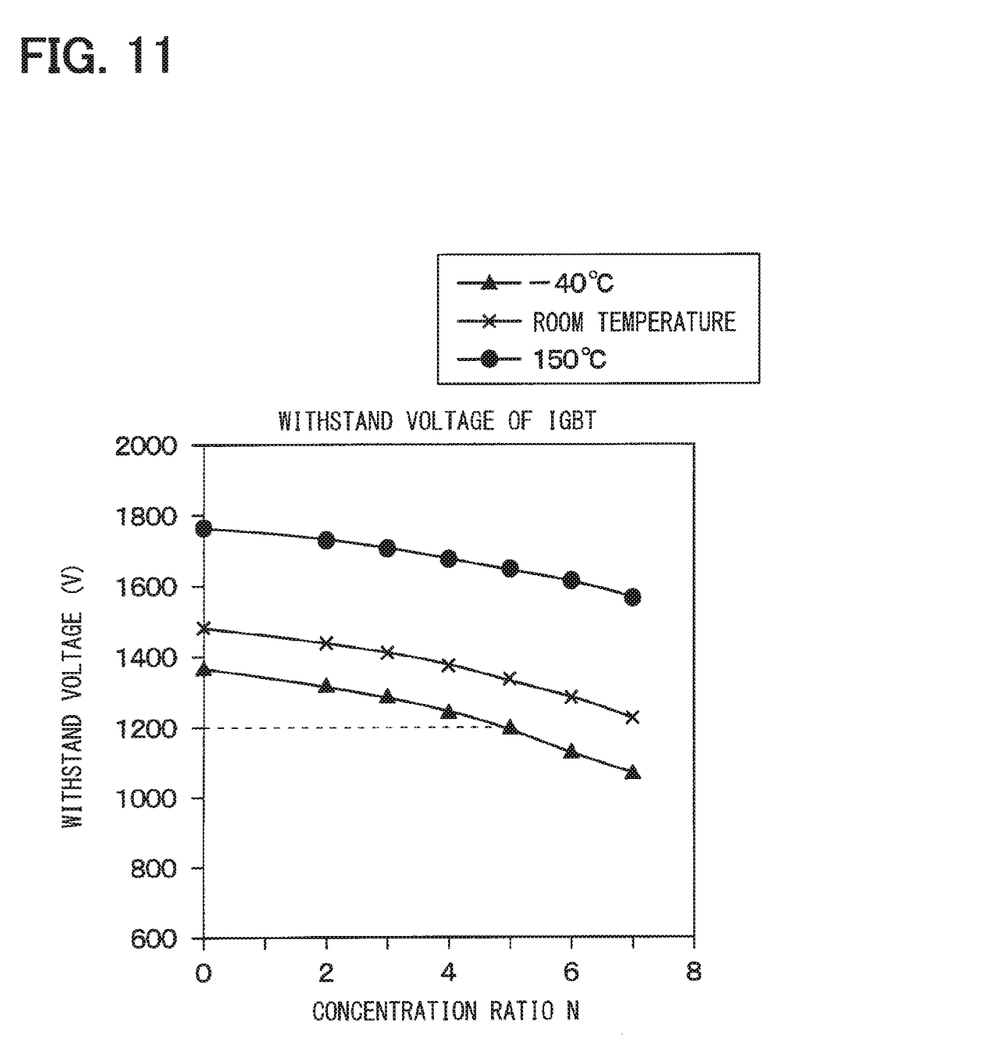
FIG. 11 is a diagram showing a relationship of the concentration ratio N and the withstand voltage obtained by the simulation with the circuit model shown in FIG. 6.

As shown in FIG. 11, as the concentration ratio N of the middle FS layer 25 is increased by increasing the doped amount of the N-type impurities, the withstand voltage of the IGBT decreases. At −40° C., when the concentration ratio N of the middle FS layer 25 is equal to or less than 5, the withstand voltage is equal to or higher than 1200 V, and when the concentration ratio N of the middle FS layer 25 is larger than 6, the withstand voltage is less than 1200 V. Therefore, in the semiconductor device having 1200 V rating, it is preferable that the concentration ratio N of the middle FS layer 25 is equal to or less than 5. Namely, it is preferable that the N-type impurity concentration of the middle FS layer 25 is equal to or less than 6 times of the raw concentration. However, even though the concentration ratio N of the middle FS layer 25 is equal to 6, the withstand voltage is equal to or greater than 800 V. Therefore, in the semiconductor device having 800 V rating, it is preferable that the concentration ratio N of the middle FS layer 25 is equal to or less than 6.

As described hereinabove, in the semiconductor device of the present embodiment, the middle FS layer 25 having the N-type impurity concentration higher than the drift layer 11 is arranged at the middle position of the drift layer 11 in the thickness direction. The middle FS layer 25 is arranged at the position having the depth ratio of 15% to 35% from the front surface 10a of the semiconductor substrate 10.

As a result, the vibrations of the collector voltage waveform in the switching off of the IGBT and the recovery waveform in the recovery operation of the FWD are restricted and the increase of the surge voltage is restricted. Since the increase of the surge voltage is restricted without increasing the impurity concentration of the collector layer 21, both of the reduction of the surge voltage and the reduction of the switching loss of the IGBT are achieved.

Furthermore, the concentration ratio N of the middle FS layer 25 is from 1 to 6. As a result, decrease of the withstand voltage is restricted in addition to the above effects. Especially, when the concentration ratio N of the middle FS layer 25 is equal to or less than 5, 1200 V or more withstand voltage is obtained.

Other Embodiments

In the above embodiment, the channels are provided at all of the portions between the trench gate structures in the IGBT region 1b. However, the channels may be thinned out by omitting the emitter regions 14 at the predetermined intervals. Hole barrier layer (or hole stopper, i.e., HS layer) may be arranged at the portions of the base layer 12 where the channels are thinned out.

In the above embodiments, the IGBT in which the first conductivity type corresponds to N-type and the second conductivity type corresponds to P-type is described. However, the present disclosure may be implemented in the P-channel-type IGBT in which the conductivity-type of each elements is inverted.

While only the selected exemplary embodiment and examples have been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiment and examples according to the present disclosure is provided for illustration only, and not for the purpose of limiting the disclosure as defined by the appended claims and their equivalents.

What is claimed is:

1. A semiconductor device having a vertical semiconductor element, the semiconductor device comprising:
   a drift layer that has a first conductivity type and is arranged in a semiconductor substrate having a front surface and a rear surface, the drift layer having a first conductivity type impurity concentration equal to a first conductivity type impurity concentration of the semiconductor substrate;
   a semiconductor layer that has the first conductivity type or a second conductivity type and is arranged adjacent to the rear surface of the semiconductor substrate;
   a second conductivity type region that has the second conductivity type and is arranged adjacent to the front surface of the semiconductor substrate;
   an upper electrode that is arranged on the front surface of the semiconductor substrate and is connected to the second conductivity type region;
   a lower electrode that is arranged on the rear surface of the semiconductor substrate and is connected to the semiconductor layer;
   a middle field stop layer that has a first conductivity type impurity concentration higher than the first conductivity type impurity concentration of the drift layer and is arranged at a position in the drift layer, a ratio of a depth of the position from the front surface of the semiconductor substrate to a thickness of the semiconductor substrate being equal to or greater than fifteen percent, and the ratio of the depth of the position to the thickness of the semiconductor substrate being equal to or less than thirty-five percent;
   a trench gate structure; and
   an emitter region that has the first conductivity type, wherein:
   a region of the semiconductor device in which the vertical semiconductor element is arranged is defined as a cell region;
   a region of the semiconductor device that surrounds the cell region is defined as an outer peripheral region;
   the vertical semiconductor element includes an IGBT and a free-wheeling diode;
   the cell region includes an IGBT region in which the IGBT is arranged and a diode region in which the free-wheeling diode is arranged;
   the semiconductor layer is arranged in the IGBT region and the diode region;
   the trench gate structure and the emitter region are arranged in the IGBT region;
   in the IGBT region:
     the semiconductor layer is a collector layer that has the second conductivity type,
     the second conductivity type region is a base layer,
     the trench gate structure includes a trench that extends to a position deeper than the base layer, a gate insulation film that is arranged on a surface of the trench, and a gate electrode that is arranged on the gate insulation film,
     the emitter region is arranged at a surface layer portion of the base layer and extends along a side of the trench,
     the upper electrode is connected to the base layer and the emitter region, and
     the lower electrode is connected to the collector layer; and
   in the diode region:
     the semiconductor layer is a cathode layer that has the first conductivity type,
     the second conductivity type region is an anode,
     the upper electrode is connected to the anode, and
     the lower electrode is connected to the cathode layer.

2. The semiconductor device according to claim 1, wherein:
   the first conductivity type impurity concentration of the middle field stop layer is equal to or greater than twice of the first conductivity type impurity concentration of the drift layer; and
   the first conductivity type impurity concentration of the middle field stop layer is equal to or less than seven times of the first conductivity type impurity concentration of the drift layer.

3. The semiconductor device according to claim 2, wherein
   the first conductivity type impurity concentration of the middle field stop layer is equal to or less than six times of the first conductivity type impurity concentration of the drift layer.

4. The semiconductor device according to claim 1, wherein:
   a region of the semiconductor device in which the vertical semiconductor element is arranged is defined as a cell region;
   a region of the semiconductor device that surrounds the cell region is defined as an outer peripheral region;
   the middle field stop layer is arranged in the cell region; and
   the middle field stop layer is not arranged at least in an outside portion of the outer peripheral region.

* * * * *